(12) United States Patent  
Li et al.

(10) Patent No.: US 7,166,485 B1  
(45) Date of Patent: Jan. 23, 2007

(54) SUPERLATTICE NANOCRYSTAL SI-SIO$_2$ ELECTROLUMINESCENCE DEVICE

(75) Inventors: Tingkai Li, Vancouver, WA (US); Sheng Teng Hsu, Camas, WA (US); Wei-Wei Zhuang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 38 days.

(21) Appl. No.: 11/175,797

(22) Filed: Jul. 5, 2005

(51) Int. Cl.  
*H01L 21/00* (2006.01)  
*H01L 29/06* (2006.01)

(52) U.S. Cl. .......................... 438/29; 438/45; 438/46; 257/12; 257/15

(58) Field of Classification Search ............... 438/29, 438/32, 36, 37, 45, 46, 47; 257/12, 15, 16, 257/17, 18, 101–103  
See application file for complete search history.

(56) References Cited

U.S. PATENT DOCUMENTS

| | | | | |
|---|---|---|---|---|
| 6,157,047 | A * | 12/2000 | Fujita et al. | 257/51 |
| 6,977,952 | B2 * | 12/2005 | Yamaguchi et al. | 257/79 |
| 7,033,912 | B2 * | 4/2006 | Saxler | 438/458 |
| 7,083,104 | B1 * | 8/2006 | Empedocles et al. | 235/491 |
| 7,095,058 | B2 * | 8/2006 | Gardner | 257/98 |
| 7,105,425 | B1 * | 9/2006 | Krivokapic | 438/481 |
| 7,105,895 | B2 * | 9/2006 | Wang et al. | 438/479 |
| 7,109,052 | B2 * | 9/2006 | Mears et al. | 438/31 |

OTHER PUBLICATIONS

Pavesi L et al. "Optical gain in silicon nanocrystals" Nature, 440-444, 2003.

Paquarello A et al. "Si 2p Core-level Shifts at the Si(001)-SiO2 Interface: A first-Principles Study" Phys. Rev. Lett. 74, No. 6 1024 (1995).

Maria E. Castagna et al. "High efficiency light emission devices in silicon." MRS spring meeting, 2003.

Keisuke Sato et al. "Multi-color luminescence from surface oxidized silicon nanoparticles." MRS Fall meeting, 2003.

Keisuke Sato et al. "Nucleation and growth of nanocrystalline silicon studied by TEM, XPS and ESR." Applied surface science, 216 (1-4), 376-381, 2003.

* cited by examiner

*Primary Examiner*—Kevin M. Picardat  
(74) *Attorney, Agent, or Firm*—David C. Ripma (57) ABSTRACT

A superlattice nanocrystal Si—SiO$_2$ electroluminescence (EL) device and fabrication method have been provided. The method comprises: providing a Si substrate; forming an initial SiO$_2$ layer overlying the Si substrate; forming an initial polysilicon layer overlying the initial SiO$_2$ layer; forming SiO$_2$ layer overlying the initial polysilicon layer; repeating the polysilicon and SiO$_2$ layer formation, forming a superlattice; doping the superlattice with a rare earth element; depositing an electrode overlying the doped superlattice; and, forming an EL device. In one aspect, the polysilicon layers are formed by using a chemical vapor deposition (CVD) process to deposit an amorphous silicon layer, and annealing. Alternately, a DC-sputtering process deposits each amorphous silicon layer, and following the forming of the superlattice, polysilicon is formed by annealing the amorphous silicon layers. Silicon dioxide can be formed by either thermal annealing or by deposition using a DC-sputtering process.

31 Claims, 5 Drawing Sheets

☒ SiO₂  ☒ Nc-Si WITH Er  ▨ ITO

SUPERLATTICE NANOCRYSTAL SI-SIO$_2$ ELECTROLUMINESCENCE DEVICE

BACKGROUND OF THE INVENTION

1. Field of the Invention

This invention generally relates to integrated circuit (IC) fabrication and, more particularly, to a nanocrystalline superlattice silicon (Si)-silicon dioxide SiO$_2$ electroluminescence (EL) device and light-emitting diode (LED) device.

2. Description of the Related Art

An early paper in the field, published in Nature (440–444, 2000) by L. Pavesi, deals with silicon quantum dots. Since 2000, there have been numerous reports of optical gain in waveguide structures, EL, and light-emitting diode (LED) applications containing silicon quantum dots in the 2 to 4 nanometer (nm) range, prepared by different techniques. However, there are inconsistencies between the various experimental reports, and theoretical studies have not conclusively identified the mechanisms for optical gain.

Many researchers have recently reported on the EL properties of Si rich silicon oxides. Keisuke Sato, from Tokyo Denki University, presented an interesting paper dealing with electroluminescence from Si-rich silicon oxide. To make the Si-rich silicon oxide thin films, he bonded small (5×5 mm) silicon pieces on a silicon dioxide target. Using radio frequency (RF) sputtering, a Si-rich silicon oxide, with silicon nano-particles of a size around 2.5 nm, was formed. The surface of Si rich silicon oxide was etched by HF and then post-annealed. Both the HF surface etching and the temperature of the post-annealing were reported to be key factors associated with the color of light emission. Red emission color was obtained from the HF treatment sample. Green emission color was observed from the sample post-annealed at 600° C., and blue for the sample post-annealed at a temperature of 900° C. From I–V measurements, Sato gave the light emission threshold voltages: 4.0V for red emission, 9.0V for green and 9.5V for blue emission. This data suggests very promising Si quantum dots EL and LED applications.

Another interesting work comes from STMicroelectronics, Italy. Dr. Maria E. Castagna et al. presented a paper entitled "High efficiency light emission devices in silicon." at the 2003 MRS spring meeting. The reported device consists of MOS structures with erbium (Er) implanted in the gate oxide. The device exhibited strong 1.54 µm (micrometer) electroluminescence at 300° k (room temperature) with a 10% external quantum efficiency, comparable to that of standard light emitting diodes using group III–V semiconductors. Emissions at different wavelengths have been achieved incorporating different rare earths (Ce, Tb, Yb, Pr) in the gate dielectric. The external quantum efficiency depends on the rare earth ions incorporated, and ranges from 10% (for a Tb doped MOS) to 0.1% (for an Yb doped MOS). Much more stable light emitting MOS devices have been fabricated using Er-doped SRO (Si-rich silicon oxide) films as the gate dielectric, but the external quantum efficiency is reduced to 0.2%. With respect to the light emission mechanism, it is thought that Er pumping occurs partly due to the impact of hot electrons, and partly by energy transfer from the Si nanostructures to the rare earth ions, depending on the Si excess in the film.

Dr. Pasquarello has proposed a theory for the photoemission associated with a Si—SiO2 interface. According to the theory, Si 2p core-level shifts occur at the Si(001)—SiO2, and depend linearly on nearest-neighbor oxygen atoms. Second nearest-neighbor effects turn out to be negligibly small. Therefore, an efficient photoemission spectra requires that all Si oxidation states be present at the interface. Based on this theory, the making of a high density Si—SiO2 interface is a critical issue for EL device applications.

It would be advantageous if a more efficient, easy to fabricate, EL device could be made based upon a high density Si—SiO2 interface.

It would be advantageous the density of a Si—SiO2 interface could be increased by using a multi-layer Si—SiO2 superlattice.

SUMMARY OF THE INVENTION

The present invention describes processes for the fabrication of a superlattice nanocrystalline Si and SiO2 structures for EL and LED device applications. Technologies are presented for making a multi-layer Si—SiO2 superlattice structure using CVD polysilicon deposition, thermal oxidation, and rare earth element implantation processes.

Accordingly, a method is provided for forming a superlattice nanocrystal Si—SiO2 EL device. The method comprises: providing a Si substrate; forming an initial SiO$_2$ layer overlying the Si substrate; forming an initial polysilicon layer overlying the initial SiO$_2$ layer; forming SiO$_2$ layer overlying the initial polysilicon layer; repeating the polysilicon and SiO$_2$ layer formation, forming a superlattice; doping the superlattice with a rare earth element; depositing an electrode overlying the doped superlattice; and, forming an EL device.

In one aspect, a p-doped/insulator/n-doped EL device is formed. The method then comprises: providing an n-type Si substrate; forming an initial p-type polysilicon layer overlying the initial SiO$_2$ layer; forming a superlattice of alternating layers of n and p-type polysilicon, with a final set of layers being n-type polysilicon overlaid by SiO$_2$; and, depositing a p-type electrode to form a p-i-n EL device.

In one aspect, the polysilicon layers are formed using a chemical vapor deposition (CVD) process to deposit an amorphous silicon layer, and annealing. Alternately, a DC-sputtering process deposits each amorphous silicon and SiO$_2$ layer, and following the formation of the superlattice, polysilicon is formed by annealing the amorphous silicon layers. As an alternative to the DC-sputtering process, the silicon dioxide layers can be formed by thermal annealing.

Additional details of the above-described method, and a superlattice nanocrystal Si—SiO$_2$ EL device are provided below.

DETAILED DESCRIPTION

Figure 1:
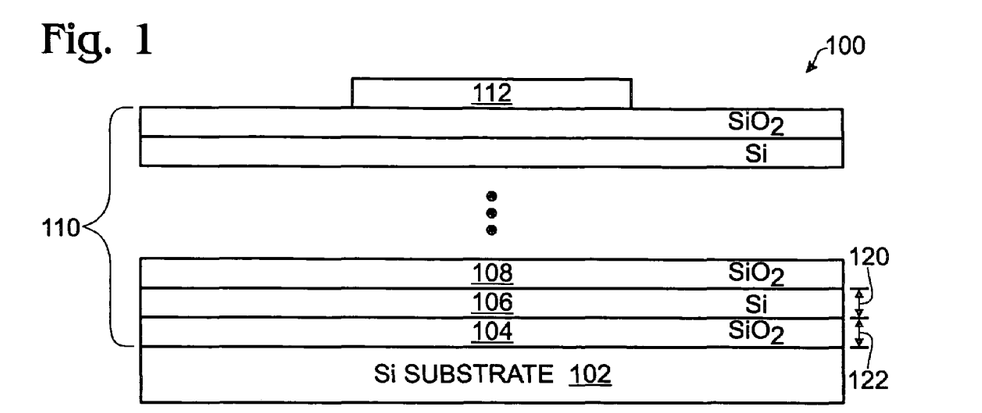
FIG. 1 is a partial cross-sectional view of a superlattice nanocrystal silicon (Si)-silicon dioxide (SiO$_2$) electroluminescence (EL) device.

FIG. 1 is a partial cross-sectional view of a superlattice nanocrystal silicon (Si)-silicon dioxide (SiO$_2$) electroluminescence (EL) device. The device 100 comprises a Si substrate 102 and an initial rare earth element-doped SiO$_2$ layer 104 overlying the substrate. An initial rare earth element-doped polysilicon layer 106 overlies the initial rare earth element-doped SiO$_2$ layer 104. Then, a rare earth element-doped SiO$_2$ layer 108 overlies the initial doped polysilicon layer 106. This layering of polysilicon and silicon dioxide layers is repeated forming a superlattice 110. An electrode 112 overlies the superlattice 110. The EL device can have as many as 100, and as few as three layers, where the number of layers is defined as the total number of polysilicon layers between the substrate and the electrode. The operating voltage increases as the number of polysilicon layers increases.

Figure 2:
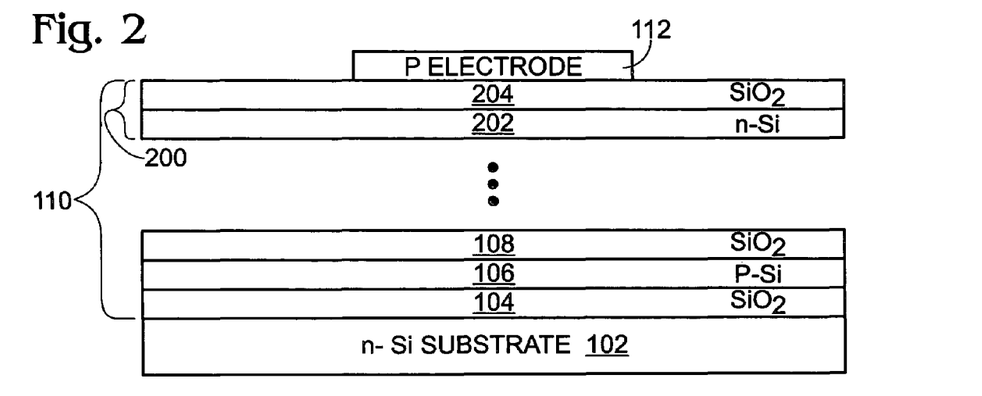
FIG. 2 is a partial cross-sectional view of a PIN variation of the Si—SiO$_2$ EL device of FIG. 1.

FIG. 2 is a partial cross-sectional view of a PIN variation of the Si—SiO$_2$ EL device of FIG. 1. The Si substrate 102 is an n-type Si substrate. The initial doped polysilicon layer 106 is a p-type polysilicon layer. The superlattice 110 includes alternating layers of n and p-type doped polysilicon. The final set of layers 200 is an n-type polysilicon layer 202 overlaid by SiO$_2$ layer 204. The electrode 112 is a p-type electrode, and a p-doped/insulator/n-doped (p-i-n) EL device is formed. Some examples of p-type electrode materials include p-Si, p-Ge, and p-GaN. However, the invention is not limited to any particular electrode materials.

Figure 3:
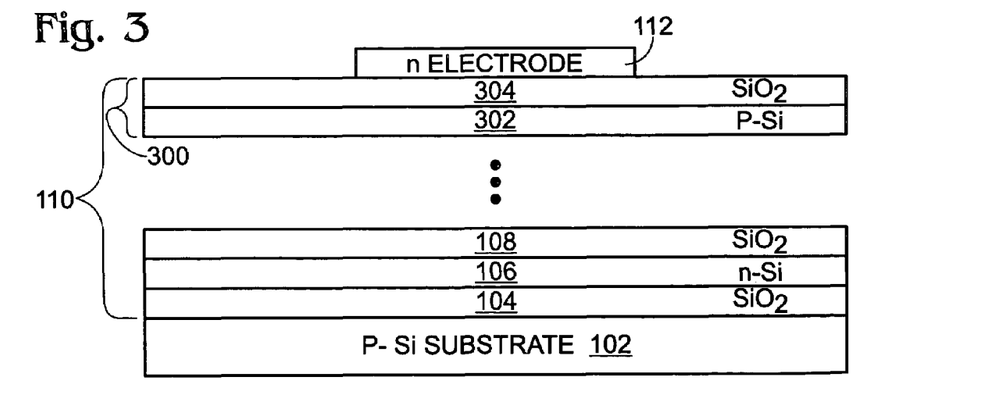
FIG. 3 is a partial cross-sectional view of an NIP variation of the Si—SiO$_2$ EL device of FIG. 1.

FIG. 3 is a partial cross-sectional view of an NIP variation of the Si—SiO$_2$ EL device of FIG. 1. The Si substrate 102 is a p-type Si substrate. The initial doped polysilicon layer 106 is an n-type polysilicon layer. The superlattice 110 includes alternating layers of p and n-type doped polysilicon. The final set of layers 300 is a p-type polysilicon layer 302 overlaid by SiO$_2$ layer 304. The electrode 112 is an n-type electrode, and the result is an n-doped/insulator/p-doped (n-i-p) EL device. Some examples of n-type electrode materials include ITO, InOx, ZnOx, and Al doped ZnOx. However, the invention is not limited to any particular electrode materials.

Returning to FIG. 1, (the following discussion is equally applicable to FIGS. 2 and 3), each rare earth element-doped polysilicon layer (i.e. layer 106) has a thickness 120 in the range of 2 to 10 nanometers (nm). Device efficiency can be improved by controlling the uniformity of the polysilicon thickness 120 between layers. In one aspect, the deviation in thickness between polysilicon layers in the superlattice is in the range of 1 to 10%.

Each rare earth element-doped polysilicon layer includes crystalline grain sizes in the range of 0.5 and 30 nm. Each rare earth element-doped SiO$_2$ layer (i.e., layer 104) has a thickness 122 in the range of 0.5 to 5 nm. Typically, the polysilicon and SiO$_2$ layers are doped with a rare earth element such as Er, Tb, Yb, Pr, Nd, La, or Ce. However, the EL device is not limited to any particular rare earth doping element. There is a direct relationship between grain size and the EL wavelength. Reducing the grain size shifts the EL peak to a short wavelength. Increasing the variation in grain sizes, therefore, broadens EL peak.

Functional Description

Figure 4:
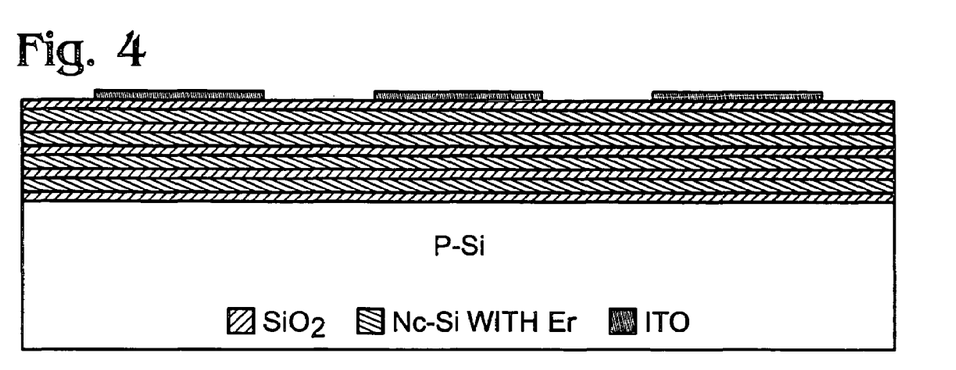
FIG. 4 is another partial cross-sectional view of the present invention EL device.

FIG. 4 is another partial cross-sectional view of the present invention EL device. The device comprises a superlattice structure of Si—SiO$_2$ interfaces, so as to obtain a high density of Si—SiO2 interfaces that can be used in EL device applications. In one aspect of the fabrication process, CVD is used to deposit a very thin polysilicon layer from 2–10 nm. Then, a thermal oxidation process converts 10–80% of the polysilicon into silicon dioxide. Repeating the polysilicon CVD deposition and thermal oxidation processes, a superlattice structure of Si—SiO2 can be obtained. Then, a rare earth element, such as Er, is implanted to make an Er-doped Si—SiO2 superlattice structure. Particulars of the CVD polysilicon deposition, thermal oxidation processes, and Er implantation processes are shown in Table 1, 2 and 3, respectively.

TABLE 1

| CVD polysilicon deposition process conditions | | | |
|---|---|---|---|
| Silane flow | Deposition temp. | Deposition pressure | Deposition time |
| 40–200 sccm | 500–600° C. | 150–250 mtorr | 1–10 min. for each layer |

TABLE 2

| thermal oxide process conditions | | | | |
|---|---|---|---|---|
| Oxygen flow | Nitrogen flow | Oxidation temp. | Oxidation pressure | Oxidation time |
| 1.6 SLPM | 8 SLPM | 700–1100° C. | atmosphere | 5–60 min. for each layer |

TABLE 3

| Er implantation process conditions | | |
|---|---|---|
| Implantation voltage | Er Dose | Implantation Angle |
| 10–500 keV | $1 \times 10^{13} - 1 \times 10^{16}$ ions/cm$^2$ | |

Figure 5:
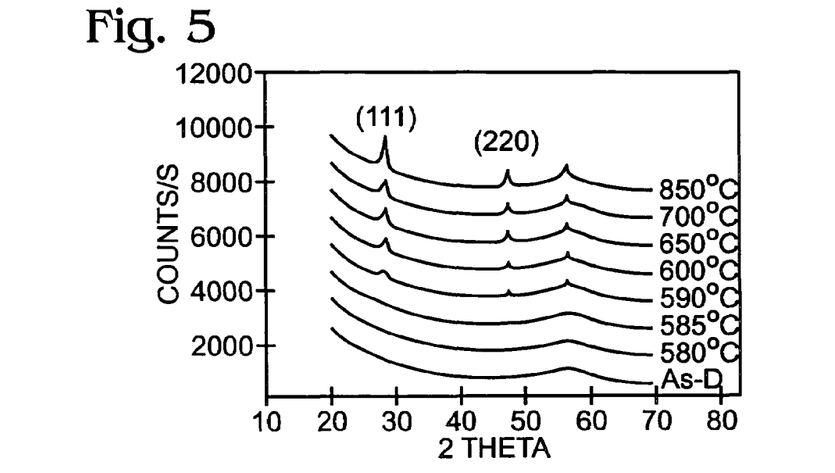
FIG. 5 shows the x-ray patterns of polysilicon thin films as deposited, and after post-annealing.

FIG. 5 shows the x-ray patterns of polysilicon thin films as deposited, and after post-annealing. The as-deposited silicon is amorphous. After post-annealing at a temperature of around 590° C., very small peaks appear at 28.2 and 47.1 degrees, meaning that the nucleation of polysilicon crystallization has occurred. With higher post-annealing temperatures, the counts of two peaks increase, meaning that the grain size of polysilicon has also increased.

Figure 6:
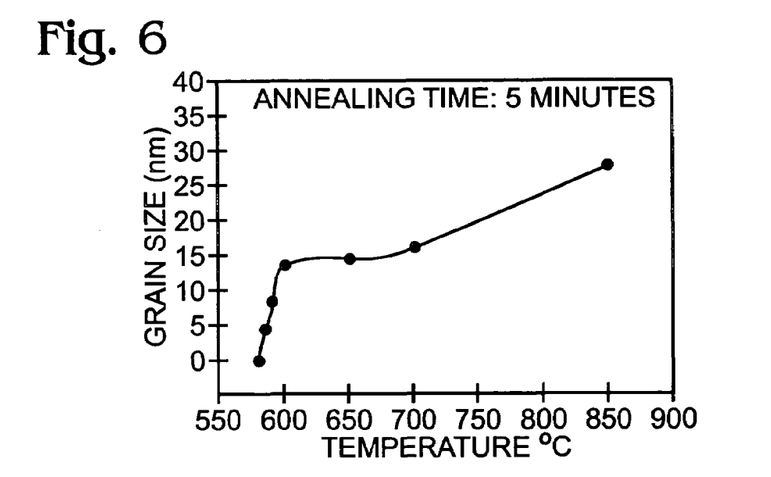
FIG. 6 is a graph depicting the formation of nanocrystalline polysilicon after thermal oxidation.

FIG. 6 is a graph depicting the formation of nanocrystalline polysilicon after post-annealing thermal oxidation. The grain size of polysilicon increases from a few nm, to 30 nm, as the thermal oxidation temperature increases from 560° C. to 850° C. The grain size of the superlattice or multi-layer Si/SiO2 structure is also controlled by polysilicon film thickness and the oxidation thickness. The grain sizes of polysilicon decrease as the film thickness of polysilicon decreases. The grain sizes of the polysilicon also decrease as the thermal oxidation thickness increases.

Figure 7:
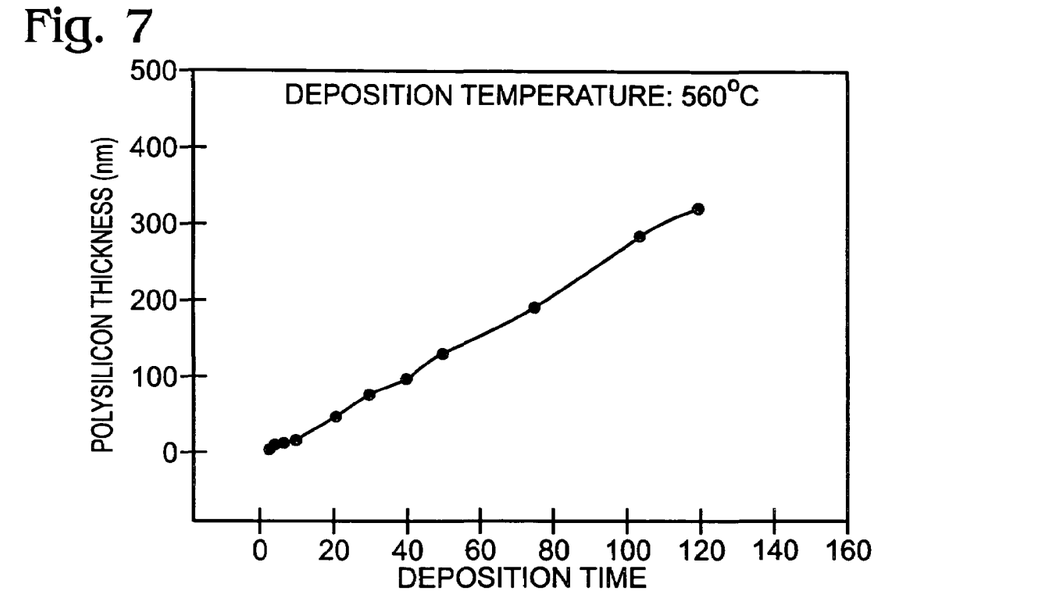
FIG. 7 is a graph depicting the film thickness of polysilicon as a function of deposition time.

FIG. 7 is a graph depicting the film thickness of polysilicon as a function of deposition time.

Figure 8:
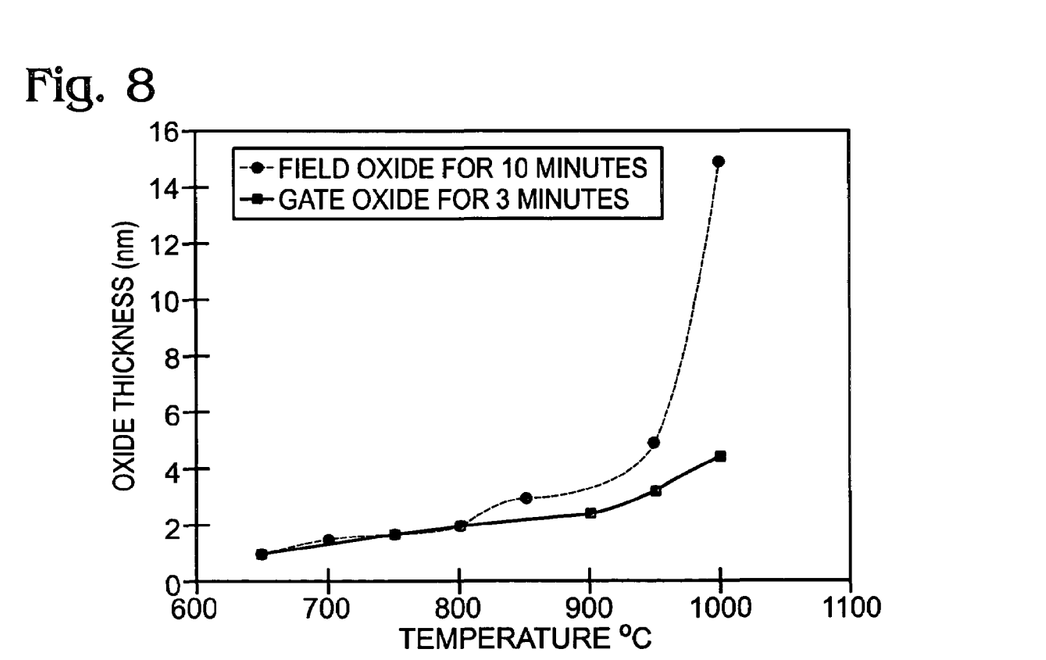
FIG. 8 is a graph depicting the oxidation thickness of polysilicon as a function of oxidation temperatures.

FIG. 8 is a graph depicting the oxidation thickness of polysilicon as a function of oxidation temperatures.

Figure 9:
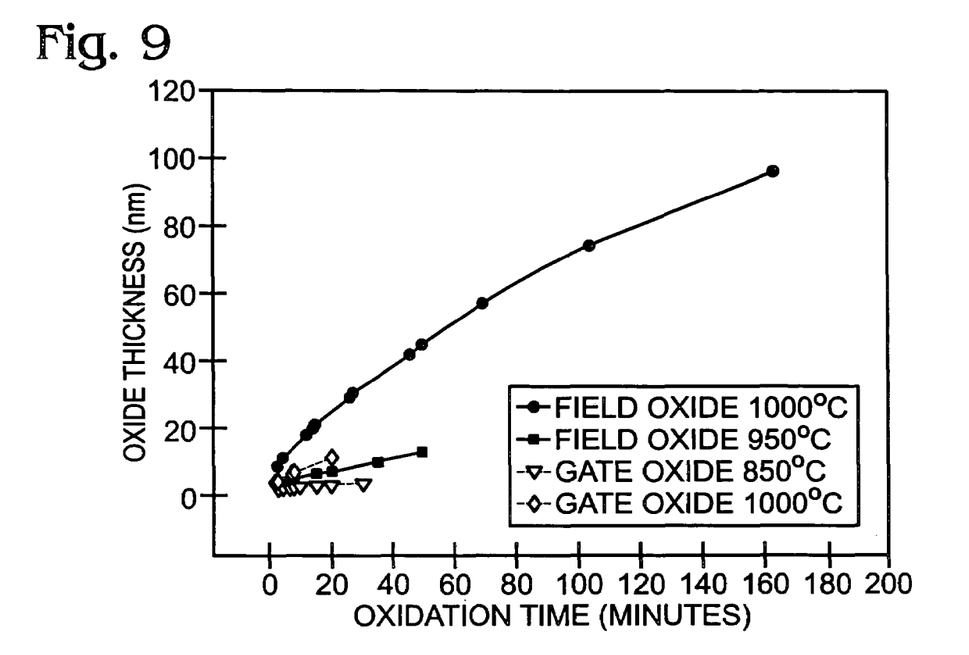
FIG. 9 is a graph depicting polysilicon oxide thickness as a function of oxidation time.

FIG. 9 is a graph depicting polysilicon oxide thickness as a function of oxidation time. The polysilicon deposition and oxidation time can be controlled to obtain the desired grain size of nano Si crystals.

Figure 10:
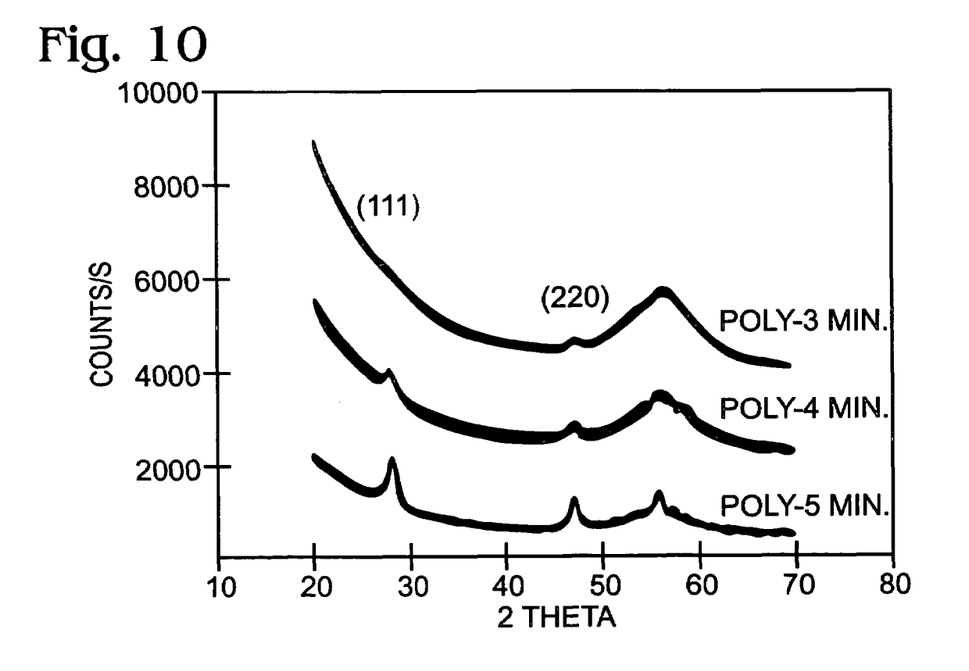
FIG. 10 shows the x-ray pattern of a superlattice Si—SiO2 structure with 5 layers of polysilicon deposition and oxidation, as a function of polysilicon deposition times.

FIG. 10 shows the x-ray pattern of a superlattice Si—SiO2 structure with 5 layers of polysilicon deposition and oxidation, as a function of polysilicon deposition times. The thickness of the as-deposited polysilicon is about 5–16 nm for each layer, and the oxide thickness for each layer is about 3–6 nm. The final grain size of the nano Si crystals is about 5–12 nm, based upon the x-ray calculations. Using these technologies, superlattice nanocrystal Si/SiO2 structures can be fabricated for electroluminescence (EL) device applications.

Figure 11:
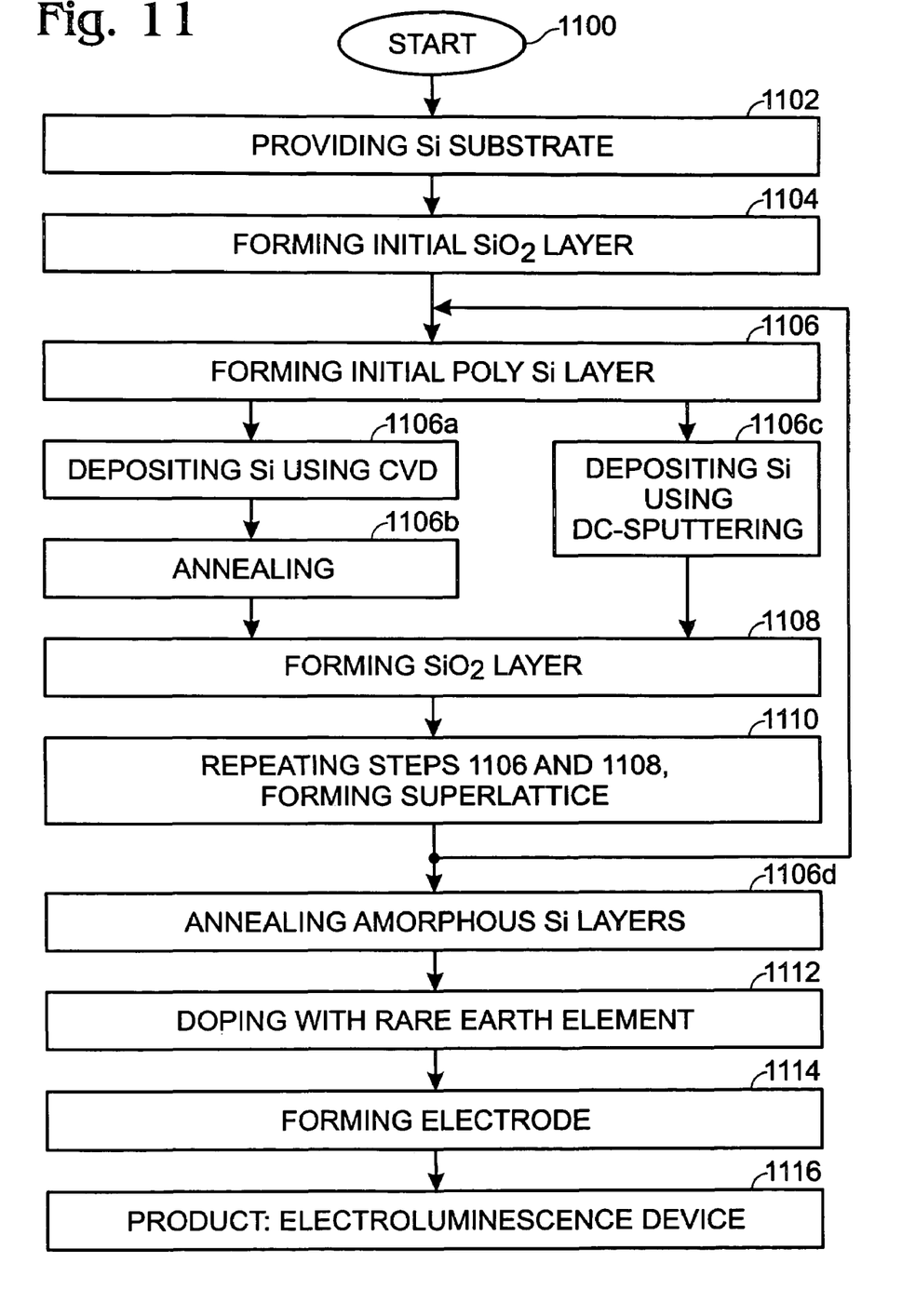
FIG. 11 is a flowchart depicting a method for forming a superlattice nanocrystal Si—SiO$_2$ EL device.

FIG. 11 is a flowchart depicting a method for forming a superlattice nanocrystal Si—$SiO_2$ EL device. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1100.

Step 1102 provides a Si substrate. Step 1104 forms an initial $SiO_2$ layer overlying the Si substrate. Step 1106 forms an initial polysilicon layer overlying the initial $SiO_2$ layer. Step 1108 forms a $SiO_2$ layer overlying the initial polysilicon layer. Step 1110 repeats the polysilicon and $SiO_2$ layer formation (Steps 1106 and 1108), forming a superlattice. Typically, a superlattice is formed with a total number of polysilicon layers in the range between 3 and 100. Step 1112 dopes the superlattice with a rare earth element. Step 1114 deposits an electrode overlying the doped superlattice. Step 1116 forms a final product, an EL device. Forming $SiO_2$ layers (i.e., Steps 1104, 1108, or 1110) includes forming $SiO_2$ layers having a thickness in the range of 0.5 to 5 nm.

In one aspect, providing the Si substrate in Step 1102 includes providing an n-type Si substrate. Forming the initial polysilicon layer in Step 1106 includes forming a p-type polysilicon layer. Repeating the polysilicon and $SiO_2$ layer formation in Step 1110 includes forming alternating layers of n and p-type polysilicon, with a final set of layers being n-type polysilicon overlaid by $SiO_2$. Then, Step 1114 deposits a p-type electrode, using a material such as p-Si, p-Ge, or p-GaN. Step 1116 forms a p-i-n EL device.

In another aspect, providing the Si substrate in Step 1102 includes providing a p-type Si substrate. Forming the initial polysilicon layer in Step 1106 includes forming an n-type polysilicon layer. Repeating the polysilicon and $SiO_2$ layer formation in Step 1110 includes forming alternating layers of p and n-type polysilicon, with a final set of layers being p-type polysilicon overlaid by $SiO_2$. Then, Step 1114 deposits an n-type electrode from a material such as ITO, InOx, ZnOx, or Al-doped ZnOx. Step 1116 forms an n-1-$p$ EL device.

In a different aspect, forming polysilicon layers (i.e., Step 1106) includes substeps. Step 1106a uses a chemical vapor deposition (CVD) process to deposit an amorphous silicon layer. Step 1106b anneals to form a polysilicon layer. The CVD process of Step 1106a may include:

flowing silane at a rate in the range of 40 to 200 standard cubic centimeters per minute (sccm);

heating the substrate to a temperature in the range of 500 to 600° C.;

creating an atmospheric pressure in the range of 150 to 250 millitorr (mtorr); and, depositing silicon for a time duration in the range of 1 to 10 minutes.

Alternately, forming polysilicon layers (i.e., Step 1106) includes other substeps. Step 1106c uses a DC-sputtering process to deposit each amorphous silicon layer. Step 1106d, following the forming of the superlattice in Step 1110, anneals the amorphous silicon layers, to form polysilicon layers. The DC sputtering process of Step 1106c may include:

providing a target material from a material such as undoped Si, p-type Si, or n-type Si;

flowing Ar with deposition pressure in the range of 5 mtorr to 10 mtorr;

using a DC plasma power in the range of 50 to 300 W;

heating the substrate to a temperature in the range of 50 to 300° C.; and, depositing for a time duration in the range of 0.5 to 10 minutes.

When the DC-sputtering process is used to deposit Si, SiO2 layers may be formed (i.e., Step 1104 or 1108) by either a DC-sputtering process or by thermal oxidation. If a DC-sputtering process is used to deposit the SiO2 layers, the process may include:

providing an undoped Si target;

flowing oxygen at partial pressure in the range of 5 to 30%, with Ar;

supplying DC plasma power in the range of 50 to 300 W;

heating the substrate to a temperature in the range of 50 to 300° C.; and, depositing for a time duration in the range of 1 to 10 minutes.

Forming the initial polysilicon layer in Step 1106, or any polySi layer (i.e., Step 1110) may include depositing silicon to a thickness in the range of 2 to 10 nanometers (nm). In one aspect, the deviation in thickness between the layers in the superlattice is in the range of 1 to 10%. The polysilicon typically has crystalline grain sizes in the range of 0.5 and 30 nm.

The formation of $SiO_2$ layers (i.e., Steps 1108 or 1110) may be performed by thermal annealing 10 to 80% of the underlying silicon layer. The thermal annealing of the underlying silicon may be accomplished by:

flowing oxygen at a rate of about 1.6 standard liters per minute (SLPM);

flowing nitrogen at a rate of about 8 SLPM;

heating the substrate to a temperature in the range of 700 to 1100° C.; and, oxidizing for time duration in the range of 5 to 60 minutes.

Doping the superlattice with a rare earth element in Step 1112 includes: implanting the rare earth element at a voltage in the range of 10 to 500 keV; and, implanting the rare earth element at a dosage in the range of $1\times10^{13}$ to $1\times10^{16}$ ions per $cm^2$. Step 1112 dopes with a rare earth element such as Er, Tb, Yb, Pr, Nd, La, or Ce.

A Si-silicon oxide nanocrystalline superlattice EL device and associated fabrication process have been presented. Specific process details and materials have been presented as examples, to illustrate the invention. However, the invention is not limited to merely these examples. Other variations and embodiments of the invention will occur to those skilled in the art.

We claim:

1. A method for forming a superlattice nanocrystal silicon (Si)-silicon dioxide ($SiO_2$) electroluminescence (EL) device, the method comprising:

providing a Si substrate;
forming an initial $SiO_2$ layer overlying the Si substrate;
forming an initial polysilicon layer overlying the initial $SiO_2$ layer;
forming a $SiO_2$ layer overlying the initial polysilicon layer;
repeating the polysilicon and $SiO_2$ layer formation, forming a superlattice;
doping the superlattice with a rare earth element;
depositing an electrode overlying the doped superlattice; and,
forming an EL device.

2. The method of claim 1 wherein providing the Si substrate includes providing an n-type Si substrate;
wherein forming the initial polysilicon layer overlying the initial $SiO_2$ layer includes forming a p-type polysilicon layer;
wherein repeating the polysilicon and $SiO_2$ layer formation, forming the superlattice, includes forming alternating layers of n and p-type polysilicon, with a final set of layers being n-type polysilicon overlaid by $SiO_2$;
wherein depositing the electrode overlying the doped superlattice includes depositing a p-type electrode; and,
wherein forming the EL device includes forming a p-i-n EL device.

3. The method of claim 1 wherein providing the Si substrate includes providing a p-type Si substrate;
wherein forming the initial polysilicon layer overlying the initial $SiO_2$ layer includes forming an n-type polysilicon layer;
wherein repeating the polysilicon and $SiO_2$ layer formation, forming the superlattice, includes forming alternating layers of p and n-type polysilicon, with a final set of layers being p-type polysilicon overlaid by $SiO_2$;
wherein depositing the electrode overlying the doped superlattice includes depositing an n-type electrode; and,
wherein forming the EL device includes forming a n-i-p EL device.

4. The method of claim 1 wherein forming polysilicon layers includes:
using a chemical vapor deposition (CVD) process to deposit an amorphous silicon layer; and,
annealing to form a polysilicon layer.

5. The method of claim 4 wherein using a CVD process to deposit the amorphous silicon layer includes:
flowing silane at a rate in the range of 40 to 200 standard cubic centimeters per minute (sccm);
heating the substrate to a temperature in the range of 500 to 600° C.;
creating an atmospheric pressure in the range of 150 to 250 millitorr (mtorr); and,
depositing silicon for a time duration in the range of 1 to 10 minutes.

6. The method of claim 1 wherein forming polysilicon layers includes:
using a DC-sputtering process to deposit each amorphous silicon layer; and,
following the forming of the superlattice, annealing the amorphous silicon layers, to form polysilicon layers.

7. The method of claim 6 wherein using the DC sputtering process to deposit an amorphous silicon layer includes:
providing a target material selected from the group including undoped Si, p-type Si, and n-type Si;
flowing Ar with deposition pressure in the range of 5 mtorr to 10 mtorr;
using a DC plasma power in the range of 50 to 300 W;
heating the substrate to a temperature in the range of 50 to 300° C.; and,
depositing for a time duration in the range of 0.5 to 10 minutes.

8. The method of claim 6 wherein forming $SiO_2$ layers includes using a DC-sputtering process to deposit the $SiO_2$ layers.

9. The method of claim 8 wherein using the DC-sputtering process to deposit the $SiO_2$ layers includes:
providing an undoped Si target;
flowing oxygen at partial pressure in the range of 5 to 30%, with Ar;
supplying DC plasma power in the range of 50 to 300 W;
heating the substrate to a temperature in the range of 50 to 300° C.; and,
depositing for a time duration in the range of 1 to 10 minutes.

10. The method of claim 1 wherein forming the initial polysilicon layer overlying the $SiO_2$ layer includes depositing silicon to a thickness in the range of 2 to 10 nanometers (nm).

11. The method of claim 10 wherein depositing silicon to a thickness includes silicon with a deviation in thickness between layers in the superlattice in the range of 1 to 10%.

12. The method of claim 1 wherein forming polysilicon layers includes forming polysilicon with crystalline grain sizes in the range of 0.5 and 30 nm.

13. The method of claim 1 wherein forming $SiO_2$ layers includes thermal annealing 10 to 80% of the underlying silicon layer.

14. The method of claim 1 wherein forming $SiO_2$ layers includes thermal annealing the underlying silicon as follows:
flowing oxygen at a rate of about 1.6 standard liters per minute (SLPM);
flowing nitrogen at a rate of about 8 SLPM;
heating the substrate to a temperature in the range of 700 to 1100° C.; and,
oxidizing for time duration in the range of 5 to 60 minutes.

15. The method of claim 1 wherein forming $SiO_2$ layers includes forming $SiO_2$ layers having a thickness in the range of 0.5 to 5 nm.

16. The method of claim 1 wherein doping the superlattice with a rare earth element includes:
implanting the rare earth element at a voltage in the range of 10 to 500 keV; and,
implanting the rare earth element at a dosage in the range of $1 \times 10^{13}$ to $1 \times 10^{16}$ ions per $cm^2$.

17. The method of claim 1 wherein doping the superlattice with a rare earth element includes doping with an element selected from the group comprising Er, Tb, Yb, Pr, Nd, La, and Ce.

18. The method of claim 2 wherein depositing the p-type electrode overlying the doped superlattice includes forming an electrode from the group of p-type materials comprising p-Si, p-Ge, and p-GaN.

19. The method of claim 3 wherein depositing the n-type electrode overlying the doped superlattice includes forming an electrode from the group of n-type materials comprising ITO, InOx, ZnOx, and Al doped ZnOx.

20. The method of claim 1 wherein forming the superlattice includes forming a superlattice with a total number of polysilicon layers in the range between 3 and 100.

21. A superlattice nanocrystal silicon (Si)-silicon dioxide ($SiO_2$) electroluminescence (EL) device, the device comprising:

a Si substrate;

an initial rare earth element-doped SiO$_2$ layer overlying the substrate;

an initial rare earth element-doped polysilicon layer overlying the initial rare earth element-doped SiO$_2$ layer;

a rare earth element-doped SiO$_2$ layer overlying the initial doped polysilicon layer;

repeated layers of rare earth element-doped polysilicon and rare earth element-doped SiO$_2$, forming a superlattice; and, an electrode overlying the superlattice.

22. The device of claim 21 wherein the Si substrate is an n-type Si substrate;

wherein the initial doped polysilicon layer is a p-type polysilicon layer;

wherein the superlattice includes alternating layers of n and p-type doped polysilicon, with a final set of layers being n-type polysilicon overlaid by SiO$_2$;

wherein the electrode is a p-type electrode; and, wherein the EL device is a p-i-n EL device.

23. The device of claim 21 wherein the Si substrate is a p-type Si substrate;

wherein the initial doped polysilicon layer is an n-type polysilicon layer;

wherein the superlattice includes alternating layers of p and n-type doped polysilicon, with a final set of layers being p-type polysilicon overlaid by SiO$_2$;

wherein the electrode is a n-type electrode; and, wherein the EL device is a n-i-p EL device.

24. The device of claim 21 wherein each rare earth element-doped polysilicon layer has a thickness in the range of 2 to 10 nanometers (nm).

25. The device of claim 24 wherein the deviation in thicknesses between layers of rare earth element-doped polysilicon in the superlattice is in the range of 1 to 10%.

26. The device of claim 21 wherein each rare earth element-doped polysilicon layer includes crystalline grain sizes in the range of 0.5 and 30 nm.

27. The device of claim 21 wherein each rare earth element-doped SiO$_2$ layer has a thickness in the range of 0.5 to 5 nm.

28. The device of claim 21 wherein the polysilicon and SiO$_2$ layers are doped with a rare earth element selected from the group comprising Er, Tb, Yb, Pr, Nd, La, and Ce.

29. The device of claim 22 wherein the p-type electrode is formed from the group of p-type materials comprising p-Si, p-Ge, and p-GaN.

30. The device of claim 23 wherein the n-type electrode is formed from the group of n-type materials comprising ITO, InOx, ZnOx, and Al doped ZnOx.

31. The device of claim 21 wherein the superlattice includes a total number of polysilicon layers in the range between 3 and 100.

* * * * *